(12) United States Patent
Goida

(10) Patent No.: US 9,260,293 B2
(45) Date of Patent: Feb. 16, 2016

(54) PRE-MOLDED MEMS DEVICE PACKAGE WITH CONDUCTIVE SHELL

(71) Applicant: Invensense, Inc., San Jose, CA (US)

(72) Inventor: Thomas Goida, Windham, NH (US)

(73) Assignee: INVENSENSE, INC., San Jose, CA (US)

( * ) Notice: Subject to any disclaimer, the term of this patent is extended or adjusted under 35 U.S.C. 154(b) by 0 days.

(21) Appl. No.: 14/578,308

(22) Filed: Dec. 19, 2014

(65) Prior Publication Data

US 2015/0102436 A1 Apr. 16, 2015

Related U.S. Application Data

(62) Division of application No. 13/795,902, filed on Mar. 12, 2013, now Pat. No. 8,941,223.

(60) Provisional application No. 61/698,966, filed on Sep. 10, 2012.

(51) Int. Cl.
*H01L 21/50* (2006.01)
*H01L 23/495* (2006.01)
*B81B 7/00* (2006.01)

(52) U.S. Cl.
CPC ............... *B81B 7/007* (2013.01); *B81B 7/0032* (2013.01); *B81B 7/0077* (2013.01); *H01L 21/50* (2013.01); *H01L 23/495* (2013.01); *B81B 2201/0257* (2013.01); *H01L 2224/48137* (2013.01); *H01L 2224/48247* (2013.01); *H01L 2924/1461* (2013.01); *H01L 2924/19011* (2013.01); *H01L 2924/19104* (2013.01); *H01L 2924/3025* (2013.01)

(58) Field of Classification Search
CPC ............................. H01L 21/50; H01L 23/495
See application file for complete search history.

(56) References Cited

U.S. PATENT DOCUMENTS

2009/0152653 A1* 6/2009 Borzabadi ............. B81B 7/0074
257/415
2010/0090295 A1* 4/2010 Zhe .......................... B81B 7/007
257/415

* cited by examiner

*Primary Examiner* — Thanh V Pham
(74) *Attorney, Agent, or Firm* — Maryam Imam; IPxLaw Group LLP

(57) ABSTRACT

A MEMS lead frame package body encloses a MEMS device enclosed in an internal cavity formed by the mold body and cover. A conductive internal shell with a connection window sits in the cavity. The MEMS device is mounted in the shell and electrically coupled to the lead frame through wire bonds directed through the connection window. To accommodate a MEMS microphone, an acoustic aperture extends through the mold body aligned with a hole in the internal shell.

8 Claims, 15 Drawing Sheets

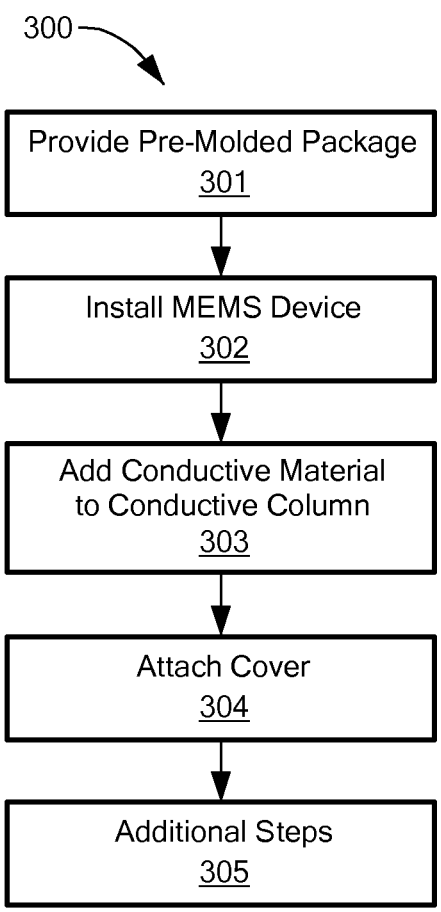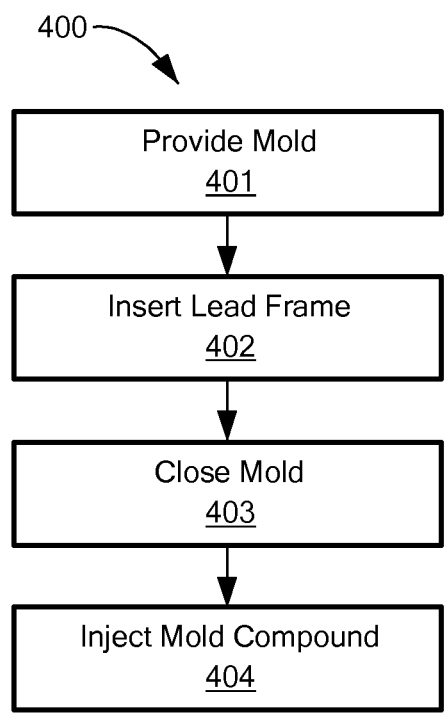
*FIG. 3*  *FIG. 4*

PRE-MOLDED MEMS DEVICE PACKAGE WITH CONDUCTIVE SHELL

This application is a divisional application of U.S. application Ser. No. 13/795,902, filed Mar. 12, 2013 now U.S. Pat. No. 8,941,223, by Thomas M. Goida, which claims priority to U.S. Provisional Patent Application No. 61/698,966 filed Sep. 10, 2012, the full disclosure of which is hereby incorporated by reference herein.

Related application filed on the same date as U.S. patent application to which the present application claims priority and having the same inventor and same assignee as the present application; and entitled "Pre-Molded MEMS Device Package Having Conductive Column Coupled to Leadframe and Cover", U.S. patent application Ser. No. 13/795,874, issued as U.S. Pat. No. 9,162,872 on Oct. 20, 2015 hereby remains incorporated by reference herein in its entirety.

TECHNICAL FIELD

The present invention relates to MEMS devices, and particularly to packaging for MEMS devices.

BACKGROUND ART

It is known in the prior art to package integrated circuits in any of a variety of plastic packages. Some plastic packages involve mounting an integrated circuit to a lead frame, and then placing the integrated circuit, and portions of the lead frame, within a mold, and filling the mold with fluid plastic. When the plastic hardens, the integrated circuit and portions of the lead frame are encapsulated within the plastic.

Such techniques and packages are not suitable for all devices, however. For example, many micro-electro-mechanical systems (MEMS) devices have moving parts. Such moving parts may be damaged or fixed in place by the injected plastic, for example. As such, MEMS devices are typically packaged in air cavity packages.

SUMMARY OF THE EMBODIMENTS

In a first embodiment of the invention, there is provided a package for a MEMS device, the package including a lead frame comprising a die-bonding area, and a plurality of bond pads; a mold body forming a cavity and an exterior surface, the mold body partially encapsulating the lead frame and having an interior window area to accommodate the die-bonding area and exterior window area in the bottom surface to accommodate the plurality of bond pads; a MEMS device mounted in the cavity; a conductive cover, the conductive cover physically coupled to the mold body and completely covering the cavity so as to form an enclosed chamber within the package, the MEMS device contained within the chamber; and a conductive column, the conductive column comprising a hole within the mold body and an electrically conductive material within the hole, the electrically conductive material electrically and physically coupled to the lead frame and to the cover.

In another embodiment, the package includes a plurality of shoulders and an integrated circuit mounted to the shoulders over the MEMS device so as to be separated from the MEMS device by a gap. In some of these embodiments, the shoulders are formed by the mold body.

In some embodiments, the MEMS device is a microphone, and wherein the lead frame further comprises an acoustic aperture.

In some embodiments, the conductive material is one of solder or a conductive epoxy.

In some embodiments, the cover is hermetically sealed to the mold body.

In some embodiments, the conductive cover is a metal cover, and in some embodiments the conductive cover is a plastic cover with a conductive coating.

In some embodiments, the plurality of bond pads are flush with the exterior surface.

In some embodiments, the mold body is one of epoxy molding compound (EMC) or liquid crystal polymer (LCP).

Some embodiments also include a conformal conductive coating on the cover and mold body.

In some embodiments, a passive device is encapsulated by the mold body. In some of these embodiments, the lead frame includes a tongue, and the passive device, also referred to herein as a circuit element, is coupled to the tongue. The passive device may be a semiconductor device, a resistor, capacitor or inductor.

In some embodiments, the package also includes a plurality of conductive bumps on a side of the package that includes the conductive cover.

In another embodiment, a MEMS lead frame package for mounting on a circuit board includes a lead frame comprising a die-bonding area and an aperture; a mold body, the mold body having an acoustic aperture aligned with the aperture in the lead frame, a bottom surface on a first side of the mold body, and a connector surface on a second side of the mold body, the second side being opposite the first side, the mold body forming a cavity extending into the connector surface, the mold body partially encapsulating the lead frame and exposing the die-bonding area in the cavity; a MEMS microphone mounted in the cavity; a cover physically coupled to the connector surface so as to completely cover the cavity such that the lead frame and the cover are electrically coupled, the cover and the cavity forming a chamber within the mold body and surrounding the microphone; a plurality of conductive bumps on the connector surface, each of the conductive bumps separated from the cover, the conductive bumps configured to couple the package to a circuit board; and a plurality of through mold vias, each of the plurality of through mold vias coupled to the lead frame and a corresponding one of the conductive bumps.

In some embodiments, the package also includes a conductive column, the conductive column comprising a hole within the mold body and an electrically conductive material within the hole, the electrically conductive material electrically and physically coupled to the lead frame, and the cover is configured to at least partially cover the conductive column.

In another embodiment, a package for a MEMS device, the package includes a lead frame comprising a plurality of interior bond pads; a mold body partially encapsulating the lead frame, the mold body forming a cavity and a bottom surface, the mold body partially encapsulating the lead frame, such that the plurality of interior bond pads are exposed within the cavity; a conductive shell having a connection window, the shell electrically coupled to the lead frame and residing within the cavity such that the connection window aligns with the plurality of interior bond pads; a MEMS device mounted to the shell, and electrically coupled to the plurality of interior bond pads through a plurality of wire bonds; and a conductive cover, the conductive cover physically and electrically coupled to the shell and completely covering the cavity such that the cover and the shell form an enclosed chamber within the package, the MEMS device contained within the chamber.

In some embodiments, the conductive cover is hermetically sealed to the shell.

In some embodiments, the mold body also includes a bottom aperture, and the conductive shell further comprises an acoustic aperture, the shell residing within the cavity such that the acoustic aperture aligns with the bottom aperture.

In some embodiments, the package also includes at least one circuit element mounted to the lead frame and embedded within the mold body, and in some embodiments the at least one circuit element comprises a semiconductor device.

In some embodiments, the conductive shell includes a plurality of shoulders, and an integrated circuit mounted to the shoulders such that the integrated circuit is mounted adjacent to, but spaced from, the MEMS device.

In some embodiments, the package also includes plurality of conductive bumps on the mold body, the conductive bumps spaced from the conductive cover.

In some embodiments, the conductive shell has a flange about its periphery and the cover is sealed to the flange of the shell.

In some embodiments, the conductive cover is hermetically sealed to the mold body.

BRIEF DESCRIPTION OF THE DRAWINGS

The foregoing features of embodiments will be more readily understood by reference to the following detailed description, taken with reference to the accompanying drawings, in which:

FIG. 3 is a flow chart that illustrates a method of fabricating a MEMS lead frame package;

FIG. 4 is a flow chart that illustrates a method of fabricating a mold body;

DETAILED DESCRIPTION OF SPECIFIC EMBODIMENTS

Figure 1A:
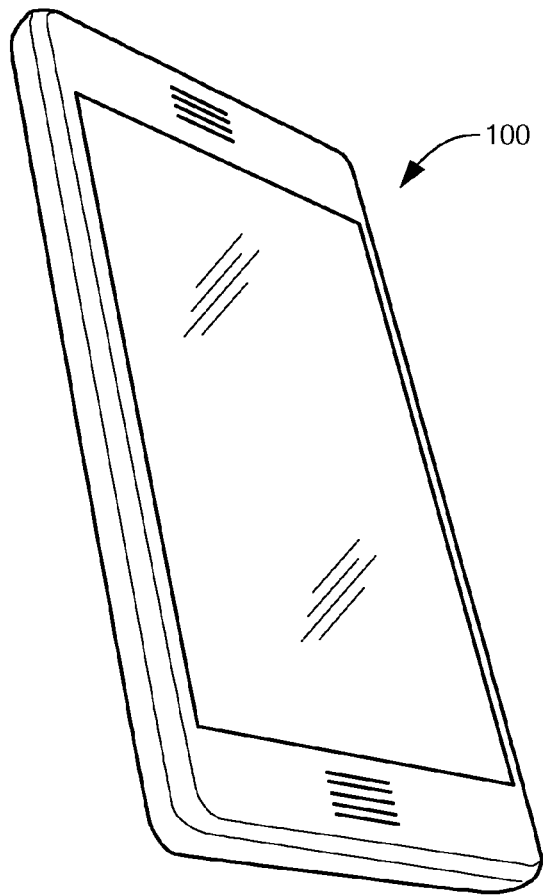
FIGS. 1A and 1B schematically illustrate a mobile phone in which a packaged MEMS device may be used.

Various embodiments provide pre-molded plastic packages that are suitable for packaging MEMS devices, including microphones for example. Some embodiments also provide protection against electromagnetic interference ("EMI") at the same time.

Traditional plastic packaging methods and structures have been unavailable for MEMS devices because the movable structures of a MEMS device would be easily damaged by injecting hot, liquid plastic into a package mold holding the MEMS device. Further, prior art plastic packages fail to provide protection against electromagnetic interference ("EMI").

A Bottom-Port Microphone

FIGS. 2A-2I schematically illustrate various views and features of a bottom-port package 200 that provides EMI protection for a MEMS device 270 and an integrated circuit 271. In this embodiment, MEMS device 270 is a MEMS microphone, and the bottom port 201 allows sound to enter the package 200 and reach the microphone 270 in an interior chamber 230 within the package 200. Although various illustrative embodiments are described in terms of MEMS microphones, the features described herein are not limited to packaging MEMS microphones.

Package 200 includes a mold body 202, a lead frame 203, and a conductive cover 204 that cooperate to enclose the MEMS device 270.

Figure 1B:
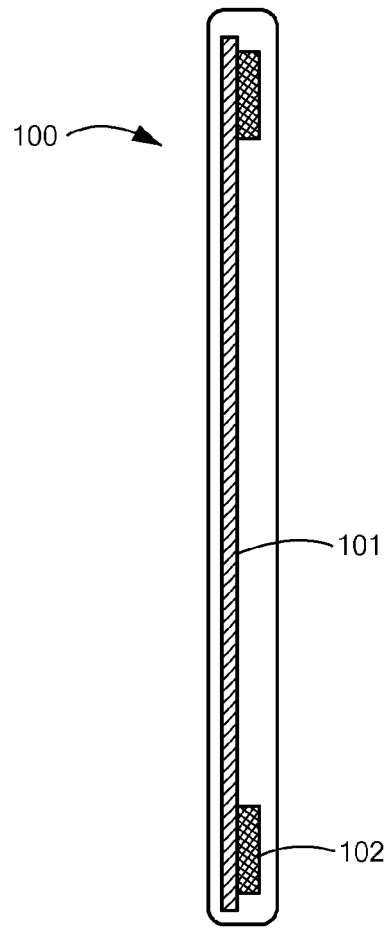

The mold body 202 is pre-molded so as to partially encapsulate the lead frame 203. In particular, the lead frame 203 is partially encapsulated in the bottom surface 202B of the mold body 202, such that portions of the lead frame 203 are exposed. The lead frame includes external bond pads 203E that are exposed on an outside surface 202B of the package 200 for the purpose of making connections to a circuit board or external system, such as the circuit board 101 in FIG. 1B in the cellular phone 100 in FIG. 1A, for example. To this end, the external bond pads are exposed through exterior window areas 202G in the mold body 202.

Figure 2A:
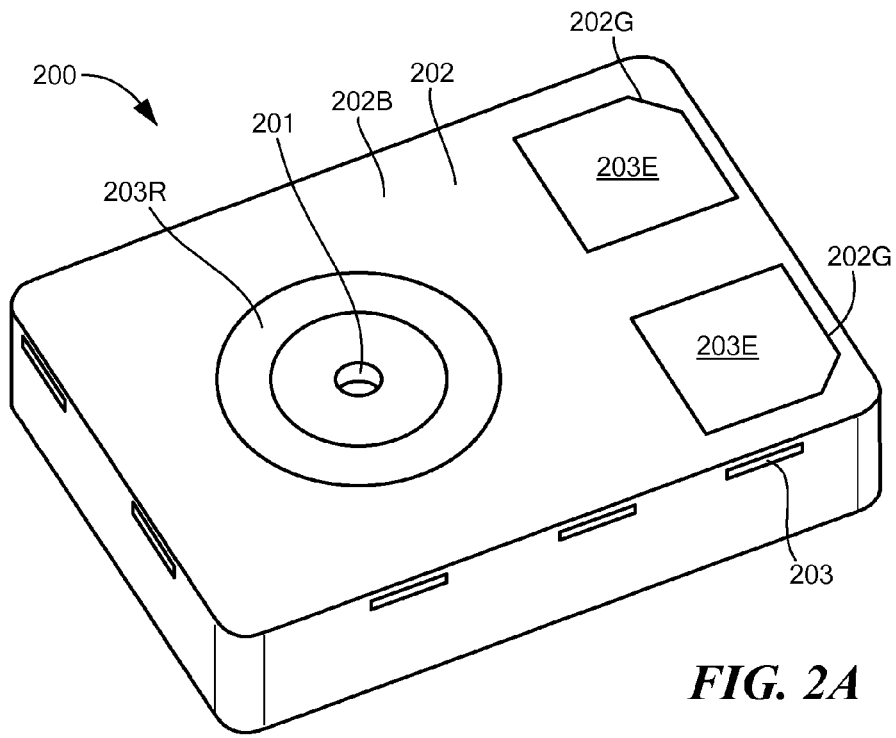
FIGS. 2A-2I schematically illustrate various views and features of a MEMS lead frame package.
Figure 2B:
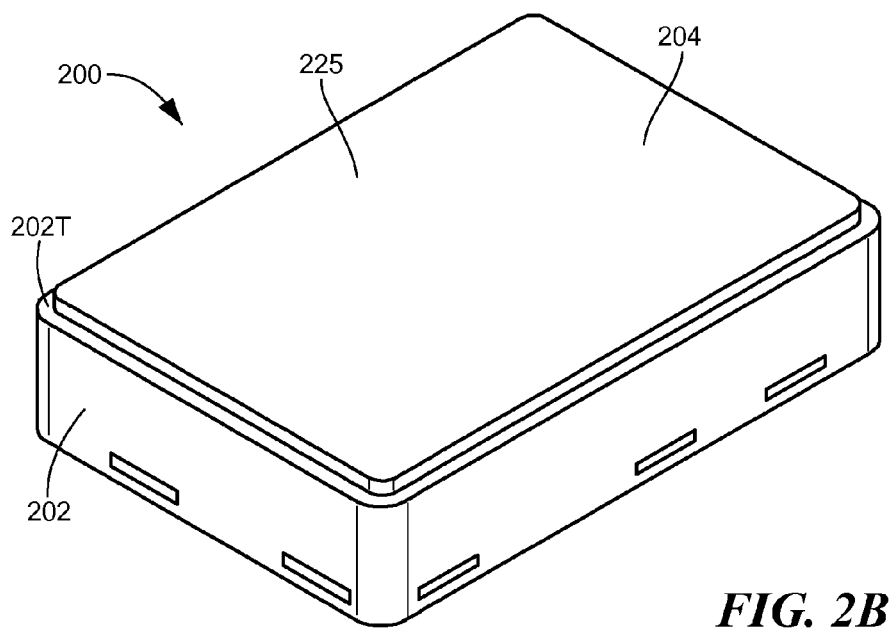
Figure 2C:
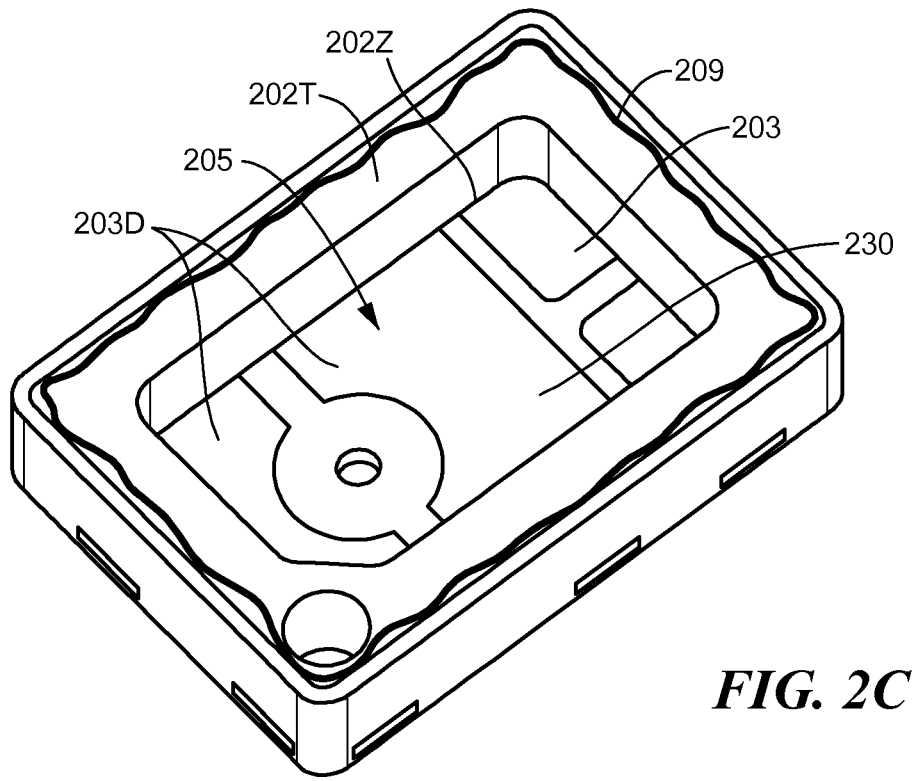
Figure 2D:
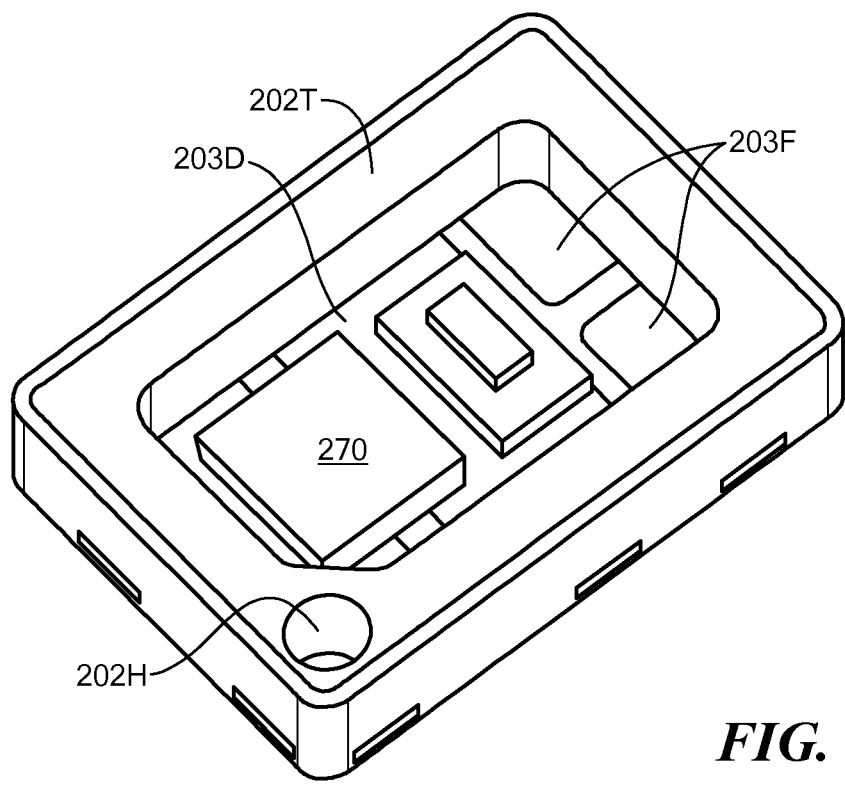
Figure 2E:
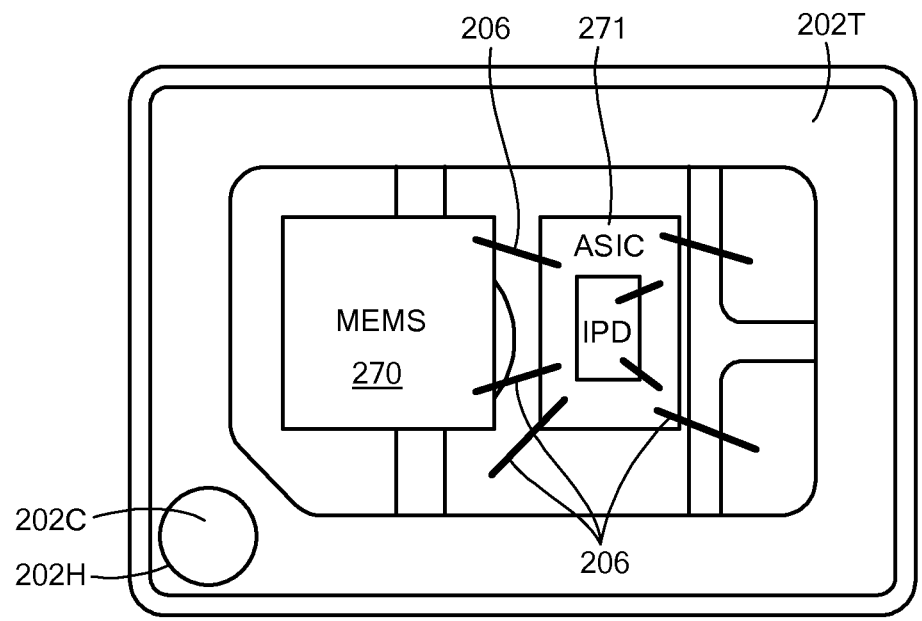
Figure 2F:
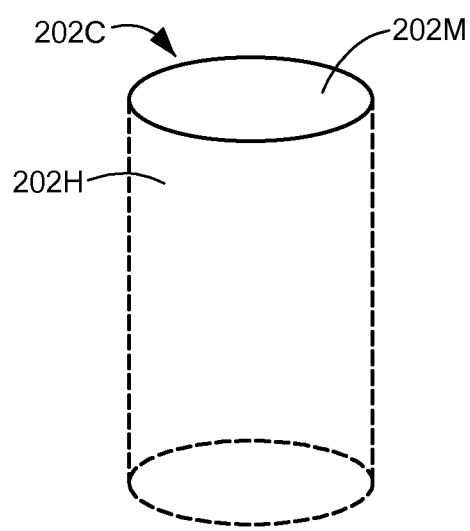
Figure 2G:
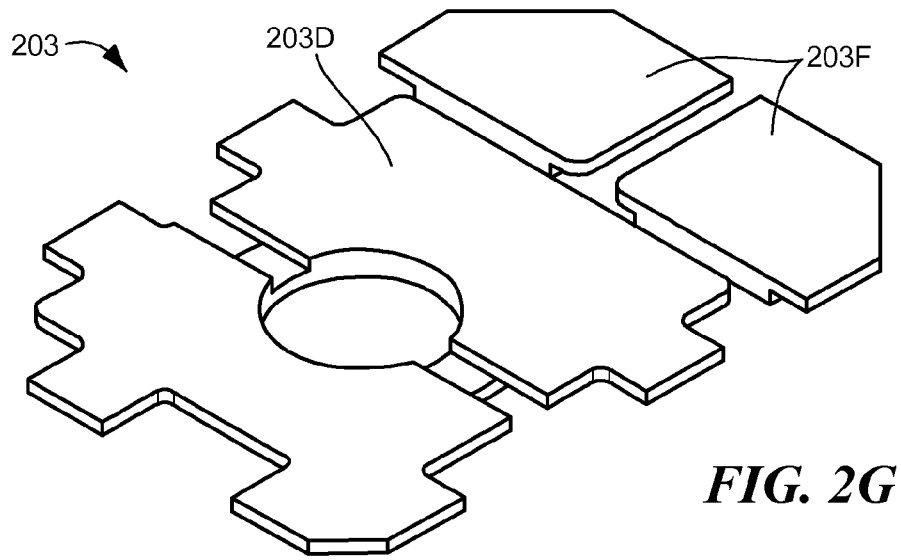
Figure 2H:
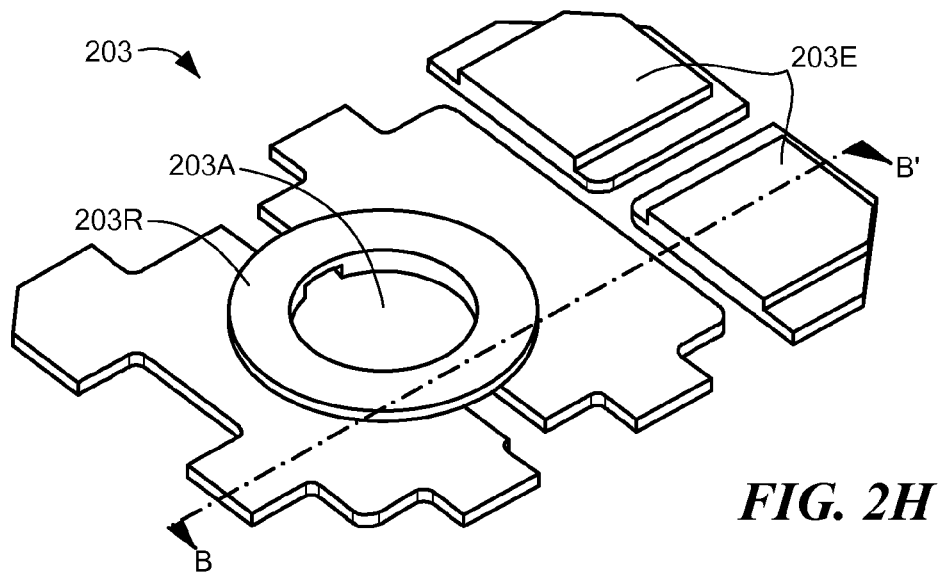
Figure 2I:
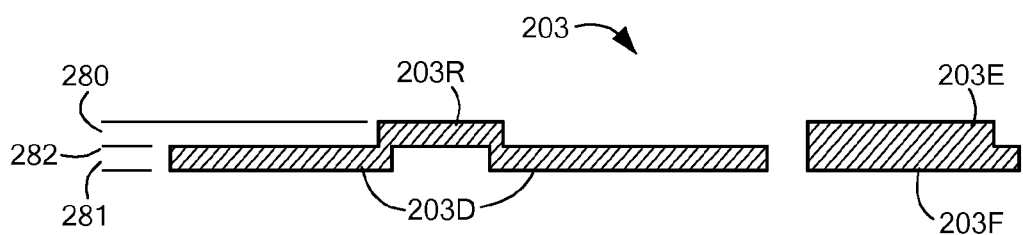

In this embodiment, the lead frame is defined by parallel, non-coplanar portions, 280 and 281, as schematically illustrated in FIGS. 2G-2I, in which FIG. 2I is a cross section of the lead frame 203 along section B-B.

Some portions of the lead frame 203 are exposed into a cavity 205 in the mold body 202. To that end, one portion 281 of the lead frame 203 includes a die bonding area 203D and several internal bond pads 203F, all of which are exposed within the cavity 205. More specifically, the bond pads 203F and die bonding area may be exposed through interior window areas 202Z. Such window areas may be formed when the mold body is injection molded, for example.

The other portion 280 of the lead frame includes external bond pads 203E and aperture surround pad 203R aligned with mold body bottom surface 202B. In specific embodiments, the external bond pads 203E and aperture surround pad 203R lie flush with the mold body bottom surface 202B. Although described separately, portions 280 and 281 are contiguous and parallel along a single plane 282.

The MEMS device 270 is mounted in the cavity, and may be electrically coupled to the die bonding area 203D and/or the internal bond pads 203F or to integrated circuit 271 by a plurality of wire bonds 206. The internal bond pads 203F are exposed on the outside of the package as external bond pads 203E. Thus, electrical signals to and from the MEMS device, or other internal circuitry, may be exchanged with the environment external to the package 200 (e.g., circuit board 101 and/or a larger system such as phone 100 of which the package 200 is a part).

The cover 204 is physically mounted to a top surface 202T of the mold body 202, which top surface 202T is on the opposite side of package 200 from the bottom surface 202B. The cover 204 may be plastic or metal, and may be conductive or non-conductive. However, in illustrative embodiments, cover 204 is conductive so as to contribute to the EMI protection provided by package 200. To this end, cover 204 may be metal, or may be plastic or other material with a conductive coating. In some embodiments, the cover 204 may be attached to the mold body 202 via an epoxy or other adhesive 209, and in some embodiments, the epoxy or other adhesive may form a seal between the mold body 202 and cover 204, such that the cover 204 is hermetically attached to the mold body 202.

In this embodiment, the mold body 202 also includes a conductive column 202C that extends from the top surface 202T into the mold body 202. In this embodiment, the conductive column 202C is a cylindrical hole 202H within the mold body, although the shape of the cross-section of the conductive column could have any shape, including rectangular shape, a triangular shape, or any of a variety of non-circular shapes. However, in its finished form, the hole 202H is not empty. Rather, the hole 202H includes an electrically conductive material 202M. The electrically conductive material 202M may be any of a variety of conductive materials, such as conductive epoxy or solder, to name but a few. In some embodiments, the electrically conductive material 202M may be a conductive epoxy, and specifically may be a bead of conductive epoxy that is the same as, and may even be contiguous with, the epoxy 209 that secures the cover 204 to the mold body 202. Alternately, the electrically conductive material may be an extension of the lead frame 203 that extends through the mold body in a direction normal to the die mounting area. The conductive material 202M extends through the hole 202H and stops substantially flush with the top surface 202H, so as not to interfere with the placement of cover 204.

The electrically conductive material 202M of the conductive column 202C is electrically and physically coupled to both the lead frame 203 and to the cover 204. In other words, the cover 204 is electrically coupled to the lead frame 203 through the conductive material 202M. In some embodiments, the cover 204 may be electrically coupled to a grounded portion of the lead frame (that is, a portion of the lead frame 203 that will be coupled to the electrical ground of the power supply that supplies power to the MEMS device).

To that end, in some embodiments the cover 204 is attached to mold body 202, and specifically to surface 202T, such that the cover 204 extends over, or at least partially over, the conductive column 202C, and therefore over the conductive material 202M. In addition, some embodiments attach the cover 204 to the mold body 204 using a conductive epoxy 209, so that the conductive epoxy serves to electrically couple the cover 204 to the conductive material 202M in conductive column 202C.

Some embodiments also include a conformal conductive coating 225 on cover 204 and portions of mold body 202. The conformal conductive coating serves to improve the EMI shielding characteristics of the package. In some embodiments, the coating may contribute to hermetically sealing the cover 204 to mold body 202, for example.

In the embodiment of FIGS. 2A-2I, the lead frame 203 includes an aperture 203A to allow sound to pass through the lead frame 203 and thereby to enter the interior of the package 200 and reach the MEMS microphone 270 inside the package 200. Of course, if the package 200 does not contain a microphone, such an aperture might be omitted.

The lead frame aperture 203A may be partially filled with mold body 202 to form an aperture. The aperture (bottom port 201) in the mold body 202 is aligned with the lead frame aperture, to allow the passage of acoustic energy into the package 200. Aperture surround pad 203R is exposed through the mold body 202 to solder onto a surface to which the package 200 is mounted (such as circuit board 101, for example).

A method of fabricating a package, such as package 200 for example, is illustrated by flow chart 300 in FIG. 3. The process 300 begins by providing 301 a pre-molded package. The pre-molded package includes a lead frame partially encapsulated in a mold body. The mold body may be made of moldable material such as epoxy molding compound (EMC) or liquid crystal polymer (LCP) for example. The mold body also has a hole for the conductive column.

A MEMS device is installed 302 in the cavity mold body. In particular, the MEMS device is installed on a die attach portion of the lead frame. Electrical connections are typically achieved through wire bonding from the MEMS device to other circuitry or to the lead frame.

Next, a conductive material is inserted 303 into the hole 202H to form the conductive column. The conductive material should terminate substantially flush with the top surface of the mold body. Typically, a conductive epoxy or a solder is used.

A cover is attached 304 to the mold body. The cover is conductive, and covers the conductive column and cavity. The cover is secured to the mold body such that the cover is in electrical contact with the conductive material in the conductive column. In this way, the cover is in electrical contact with the lead frame. Later, the package may be mounted to a circuit board or another part of a larger system so that the cover is connected to an electrical ground through the lead frame and conductive column, so as to provide EMI protection to the MEMS device and/or other circuits within the package.

Some fabrication processes may include additional steps 305. For example, some embodiments add a conformal conductive coating to the cover and top surface of the package. If the package 200 is fabricated simultaneously with many other packages from a common set of connected lead frames, an additional step may include trimming and singulating to separate or dice into individual packages. In the trimming and singulating process, an outer frame holding the die bonding area 203D and pads 203E, 203F together is disconnected leaving these areas of the lead frame electrically isolated as shown in FIGS. 2G-I.

A method 400 of fabricating a mold body with a conductive column is illustrated by the flow chart in FIG. 4. The process 400 begins by providing 401 a mold. The mold may include two opposing portions (a top portion and a bottom portion) that fit together to form a chamber into which mold compound may be introduced. The top portion of the mold may have a first projection in the shape of a conductive column. The projection extends from the part of the mold, towards the opposing part of the mold. A second projection extends from the same part of the mold, and has the shape of the cavity 205 described above.

If the mold body is to have a bottom port 201, the second projection may include an extension in the shape of the bottom port 201, which extension reaches all the way to the bottom portion of the mold. Alternately, a third projection in the shape of the bottom port 201 may extend from the bottom portion of the mold, so as to contact the second projection when the mold is closed.

A lead frame is inserted 402 into the mold, such that external bond pads 203E, and surround pad 203R if present, physically contact the bottom portion of the mold. The mold is closed around the lead frame, such that the distal ends of the above-mentioned first and second projections are in contact with the lead frame.

Mold compound is then injected 404 into the mold. The mold compound fills the interior of the mold, except where the projections occupy that space. As such, the lead frame is encapsulated in mold compound, except that the external bond pads are exposed at an external surface of the mold body, and other portions of the lead frame (such as the die bonding area and internal bond pads, for example) are exposed in the cavity left by the second projection. The first projection leaves a hole 202H as mentioned above. A third projection, if present, leaves a bottom port. When the mold compound has solidified, the mold may be opened and the mold body released from the mold.

Next, a conductive material is inserted into the hole 202H at step 405 to form the conductive column. The conductive material should terminate substantially flush with the top surface of the mold body.

A Top-Port Microphone

An embodiment of a top-port microphone package 500 is schematically illustrated in FIGS. 5A-5D. Package 500 includes a pre-molded mold body 502, a partially embedded lead frame 203, a cover 504, and conductive bumps 511. As such, the structure and its fabrication have much in common with the structure and fabrication of package 200. As such, much of the detail will not be repeated here. However, there are some significant differences, as discussed below.

Figure 5A:
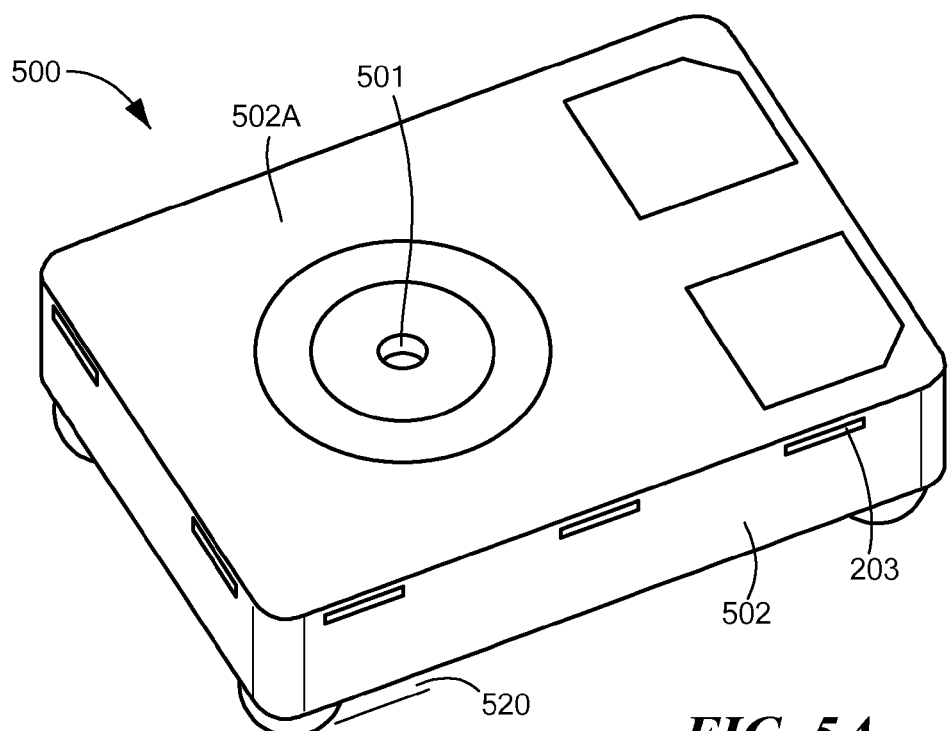
FIGS. 5A-5D schematically illustrate various views and features of a MEMS lead frame package.
Figure 5B:
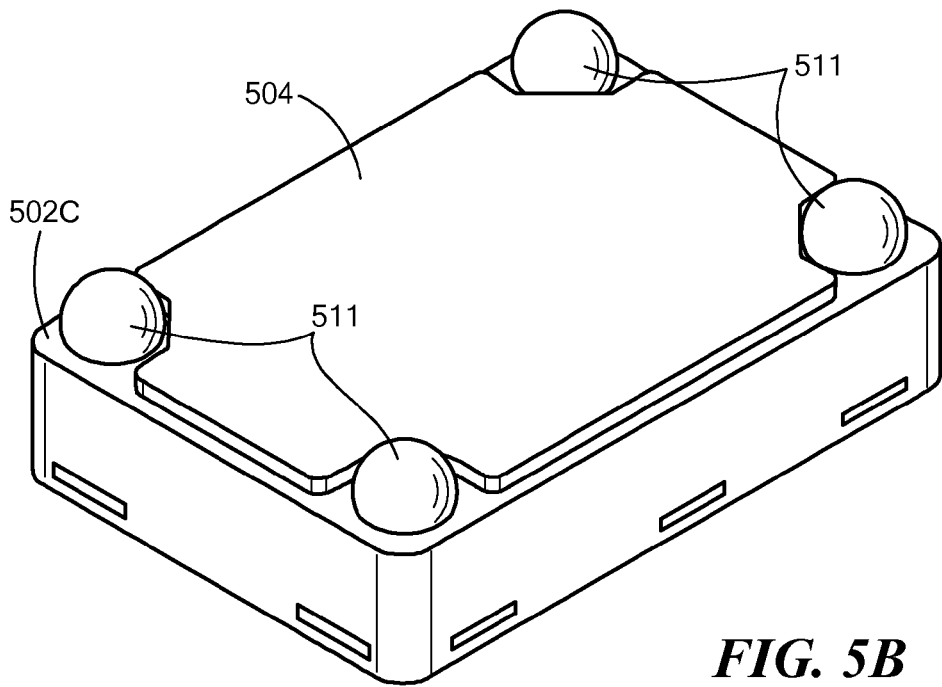
Figure 5C:
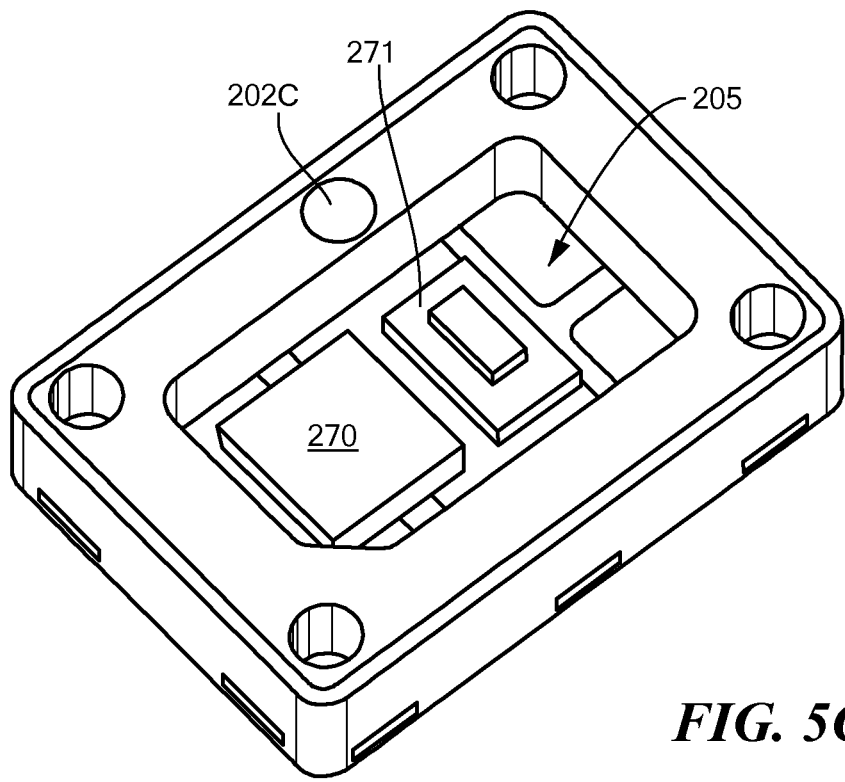
Figure 5D:
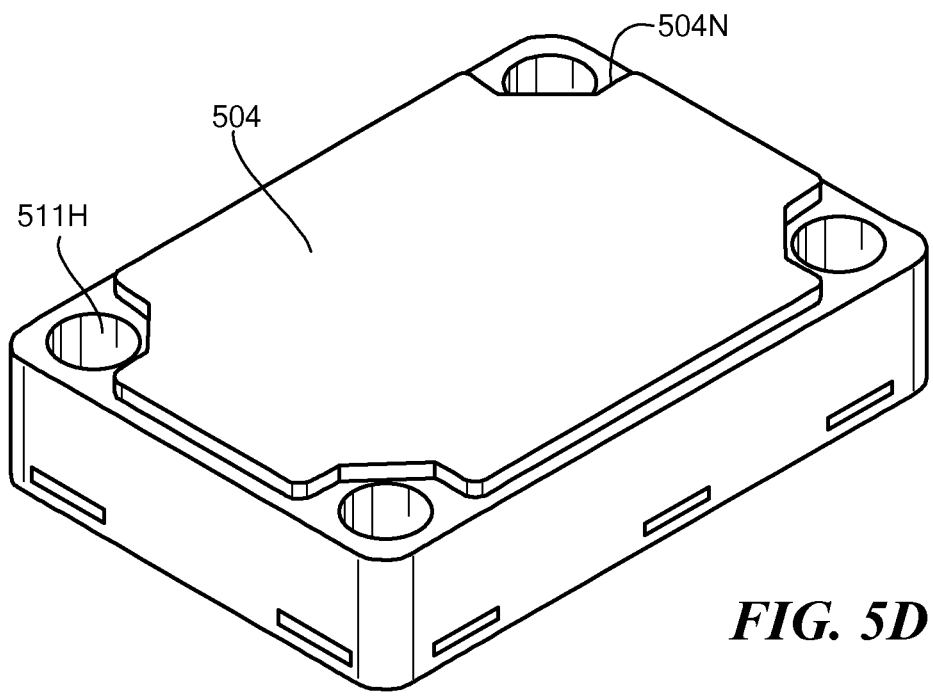

Unlike package 200, the connections from package 500 to a printed circuit board 101 (or larger system of which package 500 is a part) are made on the side 502C that includes the cover 504, and that is opposite the side 502A containing the aperture 501. In particular, the package 500 makes physical and electrical contacts by a plurality of conductive bumps 511. In specific embodiments, conductive bumps 511 may be solder balls, for example. Conductive bumps extend from the surface 502C above the cover 504. Although bond pads and an aperture surround pad are illustrated in FIG. 5A, these features could be omitted in this embodiment.

The conductive bumps 511 are, in turn, electrically coupled to the lead frame 203 via through-mold vias. As such, the through-mold via includes a conductive material to which a conductive bump may be physically and electrically connected. Each conductive bump 511 may thus be connected to specific signal or power lines for connection to the MEMS device or other circuitry within the package.

The cover 504 is similar to cover 204, but includes cut-outs or notches 504N in the vicinity of the conductive bumps 511, to accommodate the conductive bumps 511 such that the conductive bumps 511 are separated from the cover 504. Thus, at the surface the conductive bumps 511 and the cover 504 do not touch and are electrically isolated. Further, cover 504 may be electrically coupled to the lead frame 203 with a conductive column 202C. Alternatively, the mold body could be made without the conductive column 202C and one of the through mold vias or its conductive bump can be designed to contact the cover and provide electrical connection with the cover. Thus one conductive bump can serve as ground and the remaining plurality of conductive bumps can be used for other signals.

Package 500 may be fabricated in accordance with the methods 300 and 400 illustrated in FIG. 3 and FIG. 4, respectively. To that end, the method of fabricating a mold body also includes fabricating holes 511H for one or more through-mold vias. The step of adding conductive material to form the conductive column may be omitted if the package is made without a separate conductive column. Instead, conductive material can be added to fill the through-mold vias. Additional material is deposited to form the conductive bumps 511 as known in the art. The through-mold vias can be filled before the cover is attached, but preferably the vias are filled and bumps formed after the cover has been attached.

The through-mold vias and conductive bumps 511 extend beyond the surface 502C of mold body 502 and beyond cover 504, so that the package 500 is spaced from the circuit board 101 to which is it mounted by the height of the conductive bumps. The gap 520 between the package 500 and circuit board 101 allows for differences between the thermal expansion of the package 500 and the circuit board 101. As such, the extension of the through-mold vias and conductive bumps beyond surface 502C is an important feature.

Embedded Circuit Elements

Figure 6A:
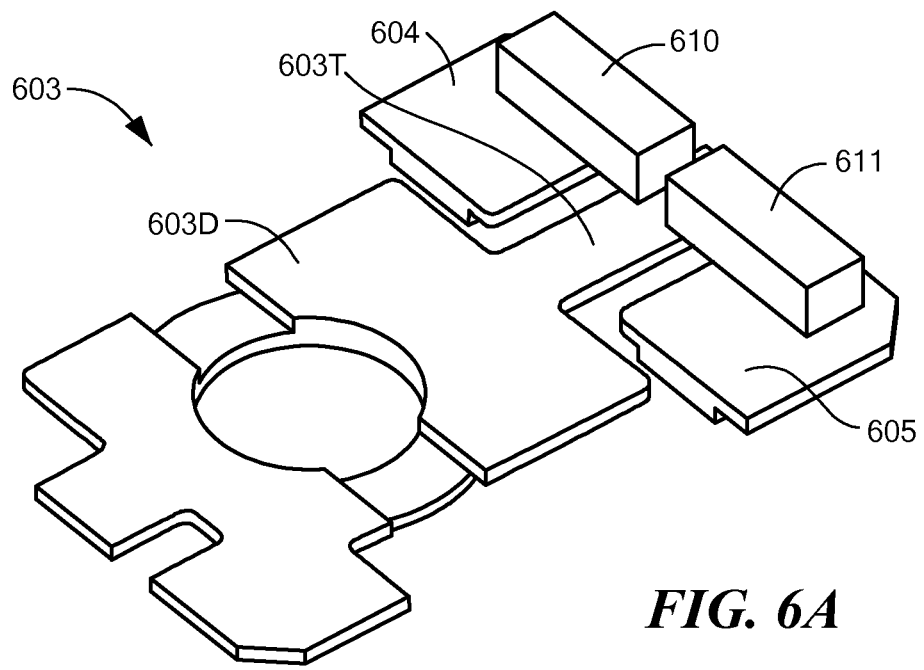
FIGS. 6A-6B schematically illustrate various views and features of a MEMS lead frame package with embedded circuit elements.

Despite forming the mold body with a cavity, in accordance with some embodiments of the present invention, circuit elements are embedded in the mold body 602. Such circuit elements may be molded into the mold body along with the lead frame. For example, various components may be mounted to a lead frame before the molding process. Such a lead frame 603 is schematically illustrated in FIG. 6A, onto which are mounted circuit elements 610 and 611.

Circuit elements 610 and 611 may be passive elements, such as resistors, capacitors or inductors, or may be semiconductor elements such as diodes or surge protection circuits, for example. Of course, elements 610 and 611 need not be the same type of element; one may be a resistor and the other a capacitor or semiconductor element, for example.

The circuit elements 610 and 611 are each electrically coupled to lead frame 603. Lead frame 603 is similar to other lead frames described herein, but it also has a tongue 603T configured for mounting circuit elements 610 and 611. In this embodiment, tongue 603T is in the same plane as die bonding area 603D. As schematically illustrated in FIG. 6A, circuit element 610 is coupled between bond pad 604 and lead frame tongue 603T. Similarly, circuit element 611 is coupled between bond pad 605 and lead frame tongue 603T.

The circuit elements 610 and 611 may be selected and configured to provide any of a variety of possible functions. For example, if tongue 603T is coupled to ground and if bond pad 604 is coupled to a power supply, circuit element 610 may be a decoupling capacitor or a surge protection circuit, for example. Alternately, elements 610 and 611 may represent a resistor and capacitor, respectively, and may provide an R-C filter on the output of the microphone 270 or integrated circuit 271.

Figure 6B:
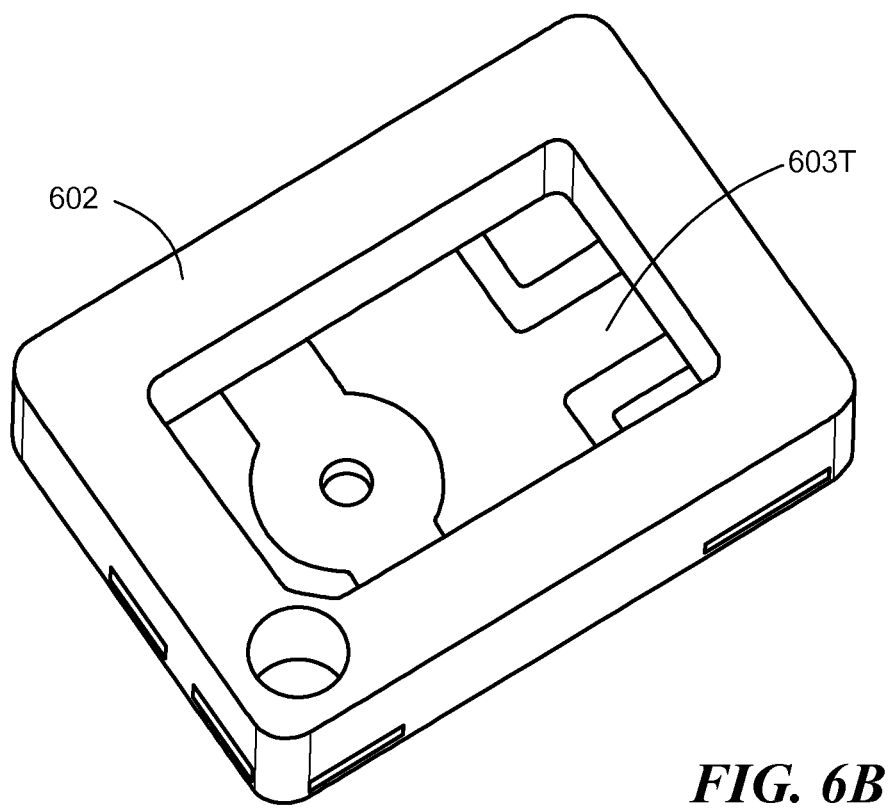

Lead frame 603 may be partially encapsulated into a mold body 602 using methods described herein for other embodiments. However, in the case of the embodiment of FIG. 6A, the circuit elements 610 and 611 are also embedded in the mold body 602, as schematically illustrated in FIG. 6B. Embedded elements may thus be conveniently included in the package without enlarging the cavity. A more miniaturized package is thus possible.

Shouldered Package

Figure 7A:
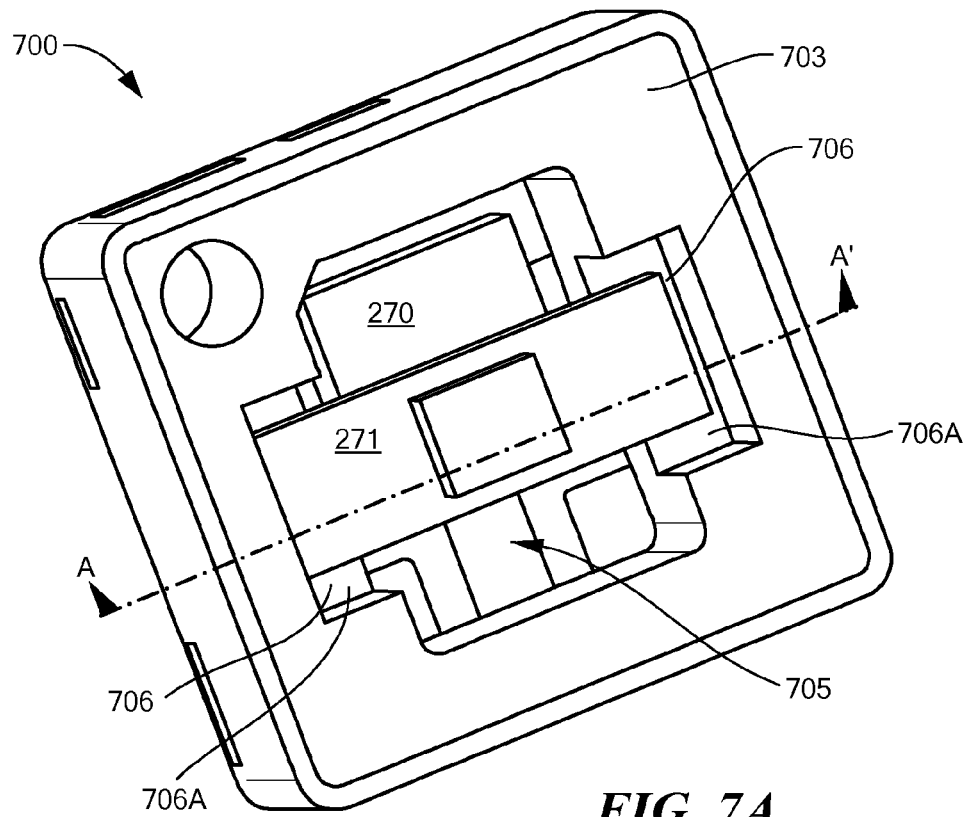
FIGS. 7A-7B schematically illustrate various views and features of a MEMS lead frame package with internal shoulders.
Figure 7B:
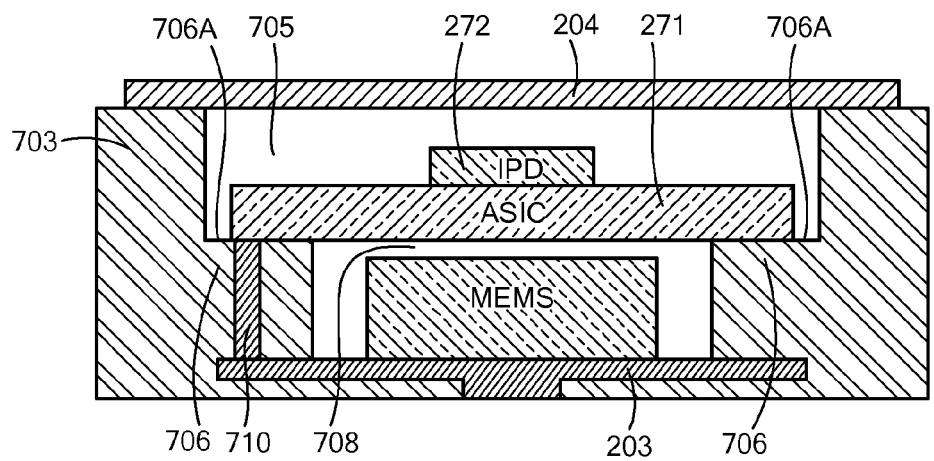
Figure 8A:
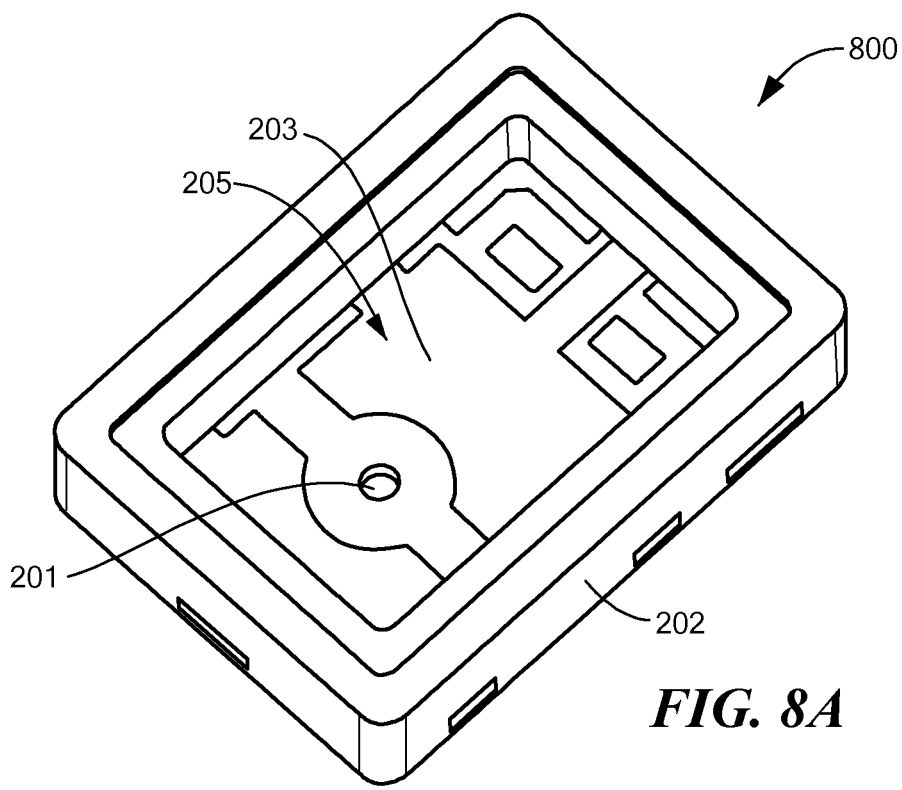
FIGS. 8A-8E schematically illustrate various views and features of a MEMS lead frame package with an internal conductive shell.
Figure 8B:
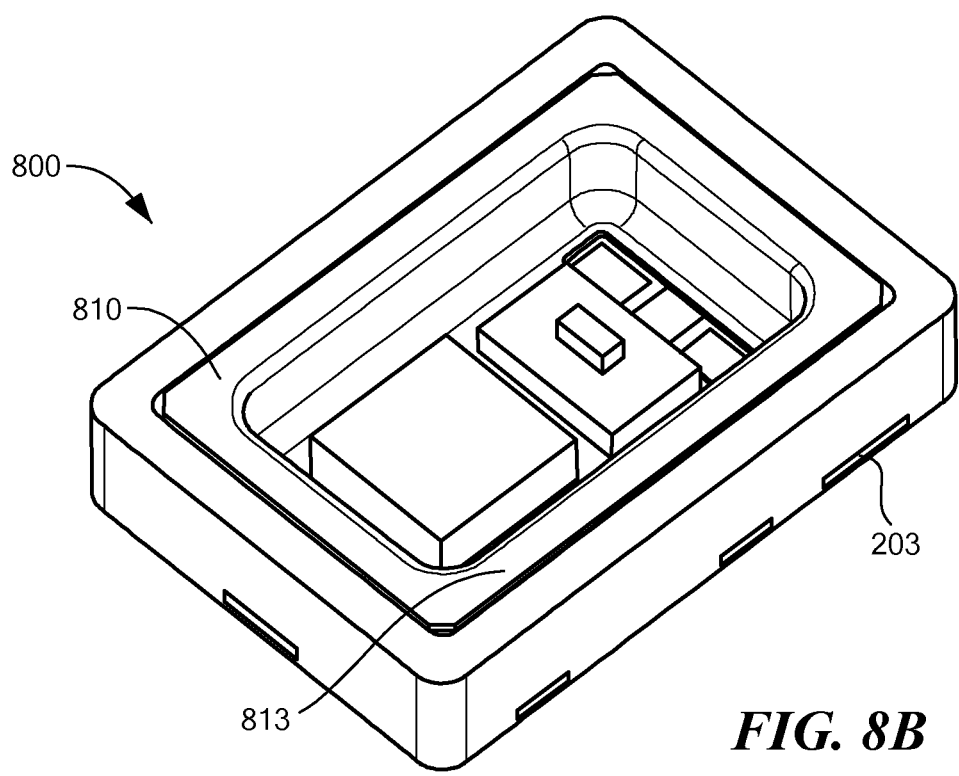
Figure 8C:
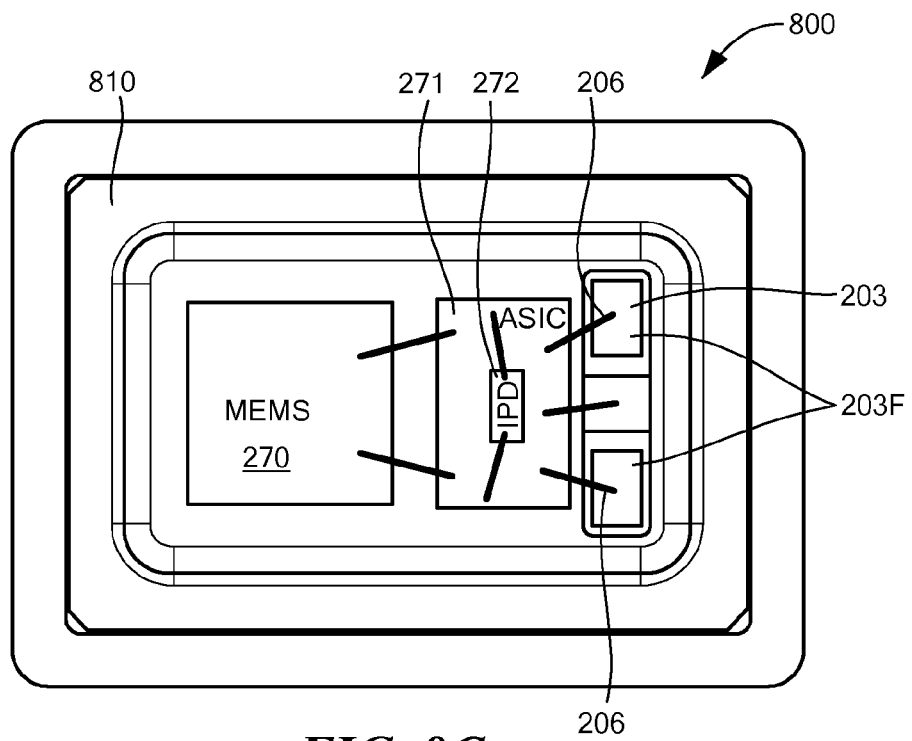
Figure 8D:
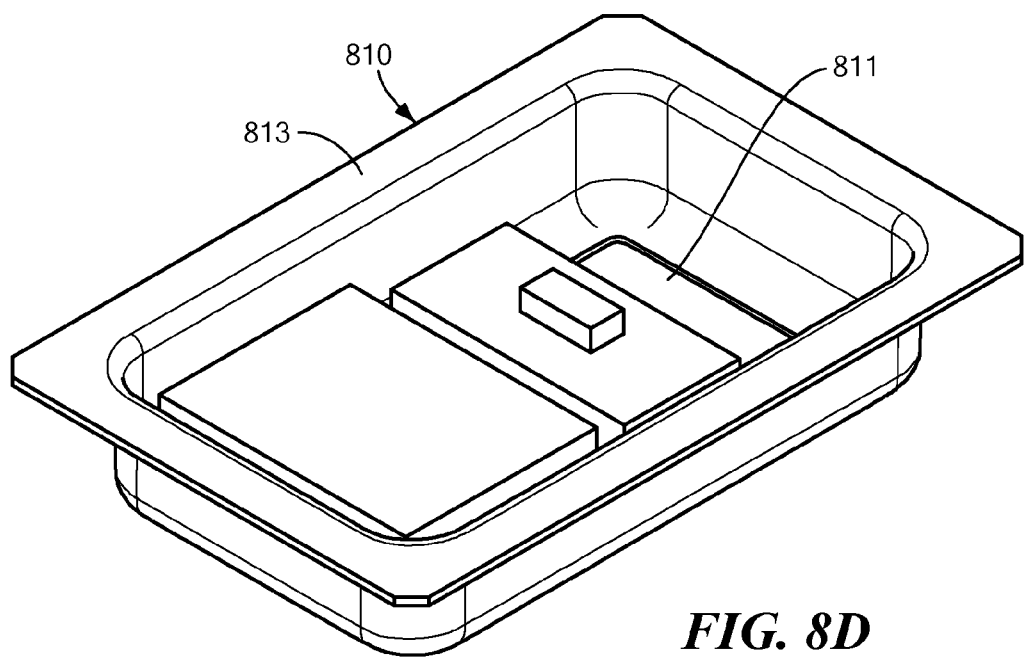
Figure 8E:
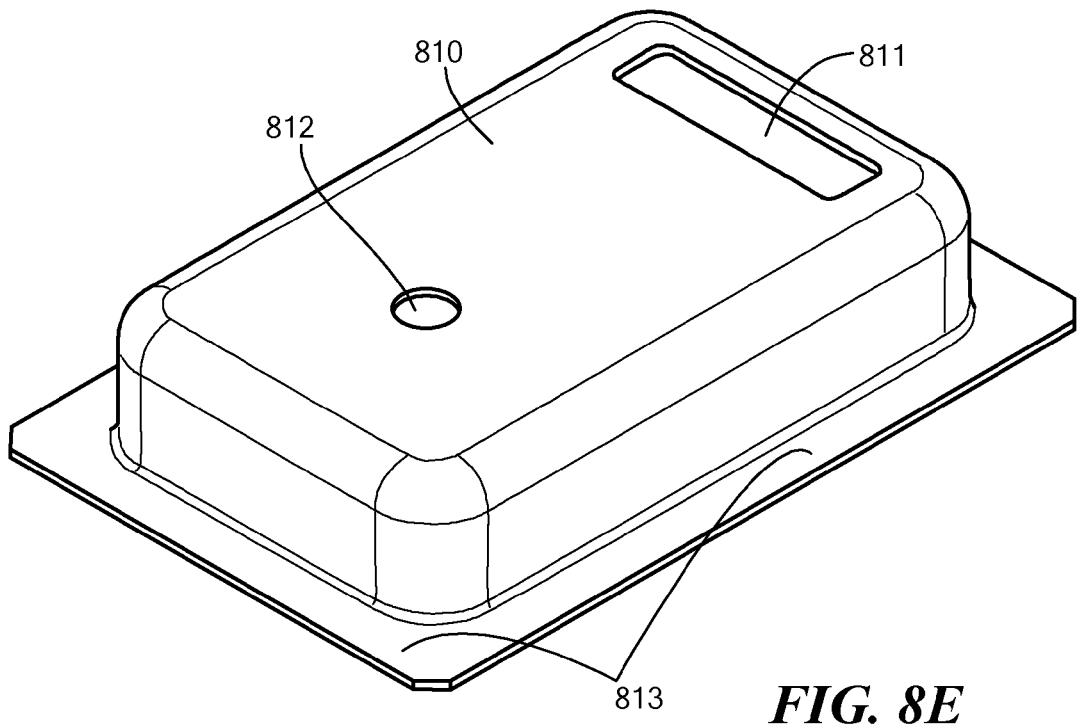

Some embodiments may enclose MEMS devices and integrated circuits in a multi-level and overlapping configuration. With such a construction, the footprint of the package may be reduced. Elements of one such embodiment are schematically illustrated in FIG. 7A, and in cross section along line A-A' in 7B, and include a mold body 703, lead frame 203, cover (or "lid") 204, MEMS device 270 and integrated circuit 271. In other embodiments, the integrated circuit may be made with one or more through-holes and the MEMS device mounted in the cavity on top of the integrated circuit. As such, the MEMS may be a microphone acoustically connected with the outside through the through-hole in the integrated circuit, an aperture in the lead frame and the bottom port of the package. This overlapping configuration is described in more detail in this inventor's US Published Patent Application 2012/0027234 entitled "Reduced Footprint Microphone System with Spacer Member having Through-Hole," the full disclosure of which is hereby incorporated by reference herein.

Referring back to FIG. 7A, mold body 703 is similar to other mold bodies described herein, except that it has a contoured, or multi-tiered, cavity 705. With the cover 204 attached, the cavity and cover form a chamber. Mold body 703 has walls with different thicknesses at different depths. For example, the thickness of mold body 703 is greater at a level up near the lead frame (e.g., 0.5 to 0.7 mm, for example) than at a level down nearer the cover 204. More specifically, cavity 705 has shoulders 706 to support integrated circuit 271 spaced from MEMS device 270. To that end, integrated circuit 271 rests on surfaces 706A of shoulders 706, and is directly above MEMS device 270. A gap 708 is thus maintained between the MEMS device 270 and the integrated circuit 271. When the MEMS device is a microphone, the chamber acts as a back volume. When mounting an integrated circuit 271 over the MEMS microphone, the gap 708 allows the MEMS microphone to be acoustically coupled to the back volume within the chamber. In this embodiment, a passive device 272, which may be known as an "integrated passive device" or "IPD," is included above integrated circuit 271.

In some embodiments, integrated circuit 271 is electrically coupled to lead frame 203 by one or a plurality of conductive columns 710 that extends vertically from the lead frame 203 through the shoulder 706. Conductive column 710, is similar to conductive column 202C, and is fabricated by a similar method, except that conductive column 710 extends only from lead frame 203 to shoulder 706.

Conductive Shell

Some embodiments include a partial shell within the package to provide additional EMI protection. FIG. 8A-8E schematically illustrate various portions of one embodiment 800, including mold body 202 and lead frame 203, which are fabricated in accordance with the methods described above.

Package 800 also includes a half-shell, or tub, 810 within cavity 205. The shell 810 may, in some embodiments, have a shape similar to the shape of a bathtub. In some embodiments, the shell 801 may include a flange 813 about its periphery to support the shell within a mold body (see, for example, FIG. 8B), and/or to provide a surface for making contact with a cover. In some embodiments, shell 810 may have shoulders and surfaces to support integrated circuit 271 spaced from MEMS device 270, similar to the shoulders 706 and surfaces 706A described above. In some embodiments, the shell 810 has a shape that matches the contour of the cavity in the mold body.

Shell 810 is conductive, and may be metal, or plastic with a conductive coating, for example. Shell 810 also includes a window aperture, 811, and if the MEMS device 270 is a microphone, may also include a sound hole 812. When installed, the sound hole is aligned with bottom port 201 in the mold body to allow sound from outside of package 800 to reach the MEMS microphone 270 within package 800, and window aperture 811 is aligned with bond pads 203F for example.

MEMS device 270 and integrated circuit 271 are mounted in the shell 810. Integrated circuit 271 is electrically coupled to internal bond pads 203F by wire bonds 206, for example. MEMS device 270 is also connected to the internal bond pads 203F through wire bonds either directly or indirectly through other circuits.

In some embodiments, shell 810 may be electrically coupled to lead frame 203, for example by being mounted to die mounting area 203D, and/or by a conductive column such as column 202C, for example. A cover, similar to covers disclosed in other embodiments, is also attached to the mold body as explained in other embodiments.

Figure 9:
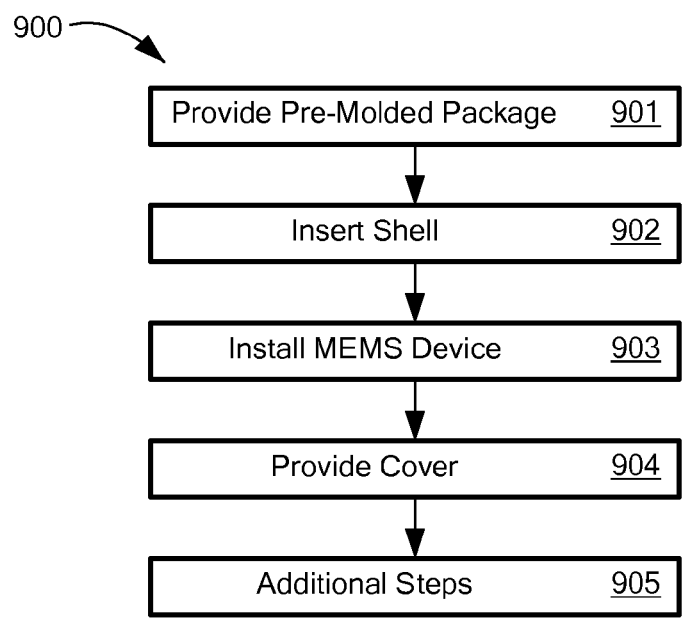
FIG. 9 is a flow chart that illustrates a method of fabricating a MEMS lead frame package with an internal conductive shell.

A method of fabricating such a package 800 is illustrated in FIG. 9, and begins by providing 901 a mold body. The mold body may be any of the variety of mold bodies described herein.

The shell is installed 902 into the cavity of the mold body. A MEMS device, and integrated circuits, may be mounted into the shell either before the shell is installed into the mold body, or afterwards. The MEMS device is wire bonded 903 to make its electrical connections. A cover is added to cover the cavity and shell at step 904, and forms a chamber within the mold body, which chamber encloses the MEMS device. The cover may be electrically coupled to the shell, and thereby to the lead frame 203. Thus, the cover can be electrically grounded without needing a conductive column through the mold body. The cover can be hermetically sealed to the flange 813 of the shell 810. Alternatively, the cover may be attached so as to be hermetically sealed to the mold body. Additional steps, such as adding a conformal conductive coating as described in other embodiments, may also be performed.

Figure 10A:
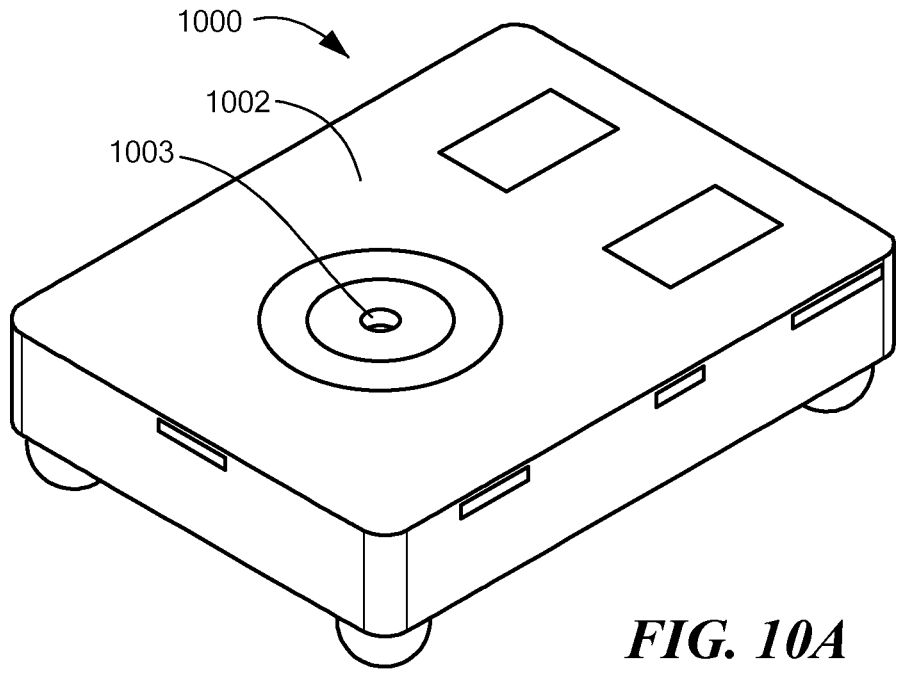
FIGS. 10A-10C schematically illustrate various views and features of a MEMS lead frame package with an internal conductive shell.
Figure 10B:
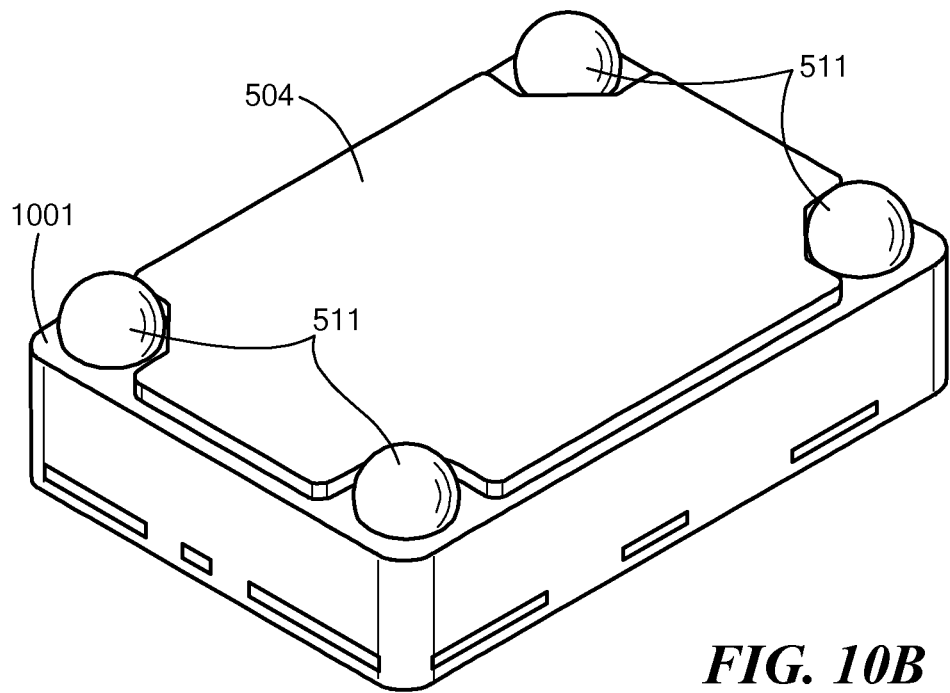
Figure 10C:
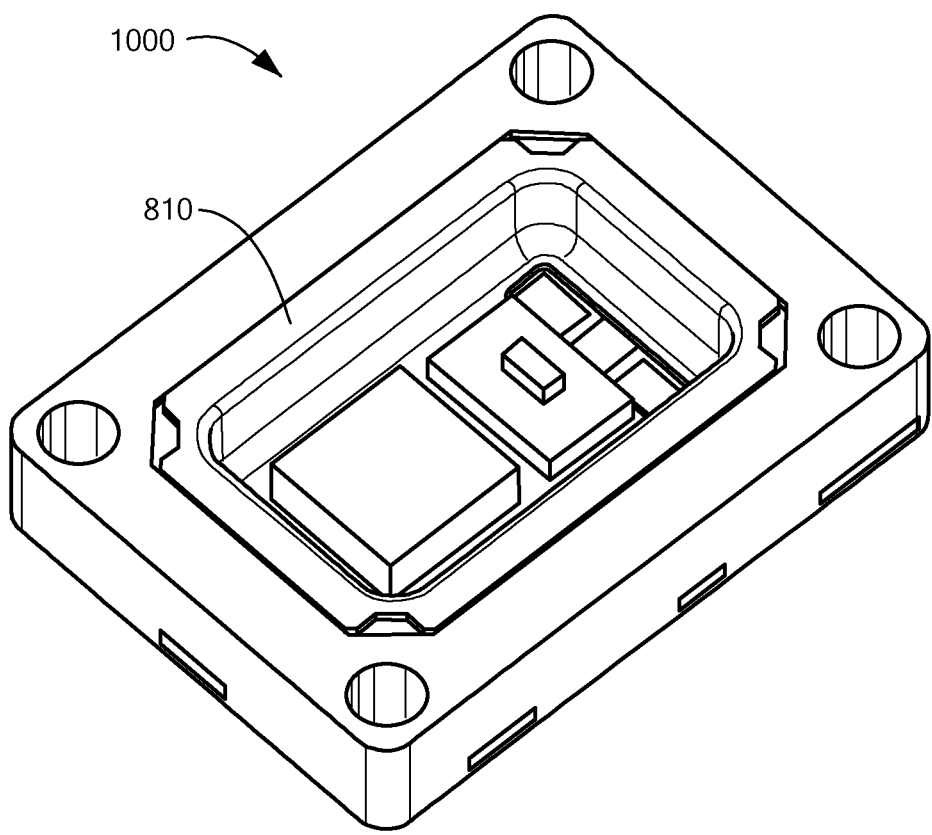

An alternate embodiment, disclosing a top-port microphone system 1000, is schematically illustrated in FIGS. 10A-10C. This embodiment is similar to the embodiment of package 800 in that it includes a lead frame, mold body, shell, and conductive cover. However, package 1000 is configured to mount to a circuit board (e.g. circuit board 101) or other system (e.g., phone 100) on the side 1001 opposite the side 1002 that includes a sound port 1003.

To that end, system 1000 includes conductive bumps 511 electrically coupled to lead frame 203 by through-mold vias, as described in connection with FIGS. 5A-5D, for example. Conductive bumps extend above cover 504.

DEFINITIONS

As used in this description and the accompanying claims, the following terms shall have the meanings indicated, unless the context otherwise requires.

The term "aligned with" when used in connection with a window and associated bond pads means that the bond pads on one side of the window are physical accessible from the other side of the window, for example by a wire bond.

The term "partially encapsulated" when used in connection with a lead frame and a mold body means that portions of the lead frame are encapsulated in the mold body, while other parts of the lead frame are exposed at or through a surface of the mold body. For example, a die bonding area or a bond pad may be exposed in a window area of a mold body.

The term "aligned with" when used in connection with acoustic apertures (e.g., holes that cooperate to allow sound to pass from the outside of a package to the inside of a package) means that the apertures overlap such that a single straight line could pass through both apertures.

The embodiments of the invention described above are intended to be merely exemplary; numerous variations and modifications will be apparent to those skilled in the art. For example, without limiting the generality of the foregoing, any of a variety of lead frames may be used in conjunction with any of a variety of mold body configurations, including those described above. In addition, all embodiments may include circuit elements embedded in the mold body. All such variations and modifications are intended to be within the scope of the present invention as defined in any appended claims.

What is claimed is:

1. A MEMS lead frame package for mounting on a circuit board, the package comprising:
    a lead frame comprising a bottom aperture, and a plurality of internal bond pads;
    a mold body,
    the mold body having an aperture surface on a first side of the mold body, and a connector surface on a second side of the mold body, the second side being opposite the first side,
    the mold body forming a cavity extending into the connector surface,
    the mold body partially encapsulating the lead frame such that the plurality of internal bond pads are exposed in the cavity, and a bottom aperture is exposed at the aperture surface;
    a conductive shell having an acoustic aperture and a connection window, the conductive shell electrically coupled to the lead frame and residing within the cavity such that the acoustic aperture aligns with the bottom aperture, and such that the connection window aligns with the plurality of internal bond pads;
    a MEMS device mounted to the conductive shell, and electrically coupled to the plurality of internal bond pads through a plurality of wire bonds;
    a cover physically coupled to the connector surface so as to completely cover the conductive shell, the cover and the conductive shell forming a chamber within the mold body and surrounding the microphone;
    a plurality of conductive bumps on the connector surface, each of the conductive bumps spaced apart from the cover, the conductive bumps extending above the cover; and
    a plurality of through mold vias, each of the plurality of through mold vias coupled to the lead frame and a corresponding one of the conductive bumps.

2. The MEMS lead frame package of claim 1, wherein the conductive cover is hermetically sealed to the conductive shell.

3. The MEMS lead frame package of claim 2, wherein the MEMS device is a MEMS microphone.

4. The MEMS lead frame package of claim 1, further comprising at least one circuit element mounted to the lead frame and embedded within the mold body.

5. The MEMS lead frame package of claim 4, wherein the at least one circuit element comprises a passive device.

6. The MEMS lead frame package of claim 1, wherein the conductive shell includes a plurality of shoulders, and wherein an integrated circuit is mounted to the shoulders such that the integrated circuit is mounted adjacent to, but spaced from, the MEMS device.

7. The MEMS lead frame package of claim 1, wherein the conductive shell includes a flange extending about a periphery of the conductive shell and wherein the conductive cover is sealed to the flange.

8. The MEMS lead frame package of claim 1, wherein the conductive cover is hermetically sealed to the mold body.

* * * * *